United States Patent
Doughty

(10) Patent No.: US 6,225,592 B1
(45) Date of Patent: May 1, 2001

(54) METHOD AND APPARATUS FOR LAUNCHING MICROWAVE ENERGY INTO A PLASMA PROCESSING CHAMBER

(75) Inventor: Frank C. Doughty, Plano, TX (US)

(73) Assignee: ASTeX-PlasmaQuest, Inc., Wilmington, MA (US)

( * ) Notice: Subject to any disclaimer, the term of this patent is extended or adjusted under 35 U.S.C. 154(b) by 0 days.

(21) Appl. No.: 09/153,193

(22) Filed: Sep. 15, 1998

(51) Int. Cl.[7] .................................................. B23K 10/00

(52) U.S. Cl. .............................. 219/121.43; 118/723 MA; 118/723 AN

(58) Field of Search .............. 219/121.43; 118/723 MA, 118/723 AN, 723 MW, 723 MR; 427/553; 156/345; 216/70; 315/111.81; 333/24.1, 248, 252; 343/772, 783, 786

(56) References Cited

U.S. PATENT DOCUMENTS

| 3,946,340 | * | 3/1976 | Simon | 333/24.1 |
| 5,053,678 | * | 10/1991 | Koike et al. | 315/111.81 |

FOREIGN PATENT DOCUMENTS

2805753 * 8/1979 (DE) ................................ H01Q/3/02

* cited by examiner

Primary Examiner—Teresa Walberg
Assistant Examiner—Quang Van
(74) Attorney, Agent, or Firm—Testa, Hurwitz & Thibeault, LLP

(57) ABSTRACT

A method and apparatus for launching microwave energy to a plasma processing chamber in which the required magnetic field is generated by a permanent magnet structure and the permanent magnet material effectively comprises one or more surfaces of the waveguide structure. The waveguide structure functions as an impedance matching device and controls the field pattern of the launched microwave field to create a uniform plasma. The waveguide launcher may comprise a rectangular waveguide, a circular waveguide, or a coaxial waveguide with permanent magnet material forming the sidewalls of the guide and a magnetization pattern which produces the required microwave electron cyclotron resonance magnetic field, a uniform field absorption pattern, and a rapid decay of the fields away from the resonance zone. In addition, the incorporation of permanent magnet material as a portion of the waveguide structure places the magnetic material in close proximity to the vacuum chamber, allowing for a precisely controlled magnetic field configuration, and a reduction of the amount of permanent magnet material required.

39 Claims, 8 Drawing Sheets

METHOD AND APPARATUS FOR LAUNCHING MICROWAVE ENERGY INTO A PLASMA PROCESSING CHAMBER

BACKGROUND OF THE INVENTION

1. Technical Field

The present invention relates generally to plasma-producing devices, in particular to electron cyclotron resonance plasma-producing devices. More particularly, the present invention relates to electron cyclotron resonance plasma-producing devices employing a combination of waveguide structures and permanent magnet assemblies.

2. Description of the Related Art

Plasma-producing devices are commonly employed in microelectronic device fabrication and similar industries requiring formation of extremely small geometries. Plasma-producing devices may be utilized in plasma-assisted processing to etch geometries into a substrate or to deposit a layer or layers of material on the substrate.

One class of such plasma-producing devices employs a magnetic field in conjunction with microwave energy. In these devices, plasma is produced from a working gas as a result of the inter-action of a magnetic field with an electric field. A microwave waveguide may be employed to inject microwaves, which have an associated electric field, into an evacuable chamber containing the working gas. The microwaves propagate into the chamber in a direction substantially perpendicular to the surface of the workpiece. The electric field associated with the microwaves is perpendicular to the direction of propagation, radially outward from a line following the direction of propagation of the microwaves. Plasma ions from the working gas are accelerated by the electric field along such radial lines.

A magnetic field is provided close to the point of injection in a direction generally aligned with the direction of microwave propagation, causing plasma electrons within the working gas to rotate around the direction of microwave propagation at right angles with the magnetic field. At the plane of resonance, the point at which the electric field associated with the microwave energy and the rotation of plasma electrons are in phase, the microwave electric field constantly accelerates the rotating plasma electrons. The energy of this acceleration dissociates molecules of the working gas into atoms and removes electrons from the atoms, creating ions and additional electrons. The ions then diffuse and impinge upon the exposed surface of the workpiece.

The requisite magnetic field may be provided by a single permanent magnet situated above the outlet of the microwave waveguide into the chamber. An adjusting element may be provided to vary the spatial relationship between the magnet and the waveguide opening, thus altering the location of the plane of resonance or "resonance zone" within the chamber.

Plasma uniformity across the surface of the workpiece is generally necessary to achieve etched geometries or deposited layers having relatively uniform dimensions from the center to the periphery of the workpiece surface. Prior art attempts to obtain plasma uniformity focusing on achieving a uniform magnetic field require very large and bulky magnets. Another drawback of the use of permanent magnets in plasma-producing devices relates to the necessity of positioning the microwave waveguide between the permanent magnet and the workpiece. This constrains placement of the permanent magnet with respect to the chamber, and as the magnet face is moved further from the chamber, larger, more expensive magnets are required to produce the requisite magnetic field.

In these plasma-producing devices, also referred to as electron cyclotron resonance plasma systems, the electron cyclotron resonance absorption occurs in a region of magnetic field strength where the gyromotion of the electrons is resonant with the excitation frequency. A fairly typical drive frequency is 2.45 GHz, which is resonant at a field of 875 G.

Microwave energy transmits from a source (at atmosphere) to the plasma (at vacuum) through waveguide structures. A microwave window, transparent to microwave energy, is required to separate the vacuum from atmosphere. This vacuum window is typically made of quartz. During processing, this window is exposed to the plasma process and may be either etched or subject to deposition, depending on the type of processing. Typical waveguide structures used include the standard rectangular or circular cross section waveguides and coaxial structures.

Efficient coupling of the microwave energy into the plasma requires that the load be matched to the source. The structure that couples the waveguide to the plasma chamber and plasma is termed a "launcher" or "coupler". The coupling of the waveguide to the plasma chamber should also provide for a large area of uniform or symmetrical plasma generation. The field distribution coupling from the waveguide to the plasma should control the plasma uniformity to a large extent. This means uniform over an area as large as the workpiece.

In practice, the plasma production region connects to or feeds a larger process chamber in which the magnetic field directions or diffusion (perhaps within a magnetic bucket structure) acts to enhance uniformity. In this case, the plasma production region may not need to be of a large area, however uniformity remains a desirable trait. Usually uniformity over a disk region is desired. However, uniformity over an annular region or a region of field with mirror symmetry may be useful. In the case of uniformity over an annular region that produced by a circularly symmetric field distribution, the remaining structures may act to homogenize the annular plasma to a uniform disk at the workpiece. A field distribution with a mirror symmetry may still produce a time averaged circularly symmetric plasma, provided the mirror symmetry plane rotates with time.

The launcher is a matching device to efficiently transmit the microwave energy from the source to the vacuum vessel. Once transmitted into the vacuum vessel, the microwave energy will be absorbed by the plasma. For a given frequency (or plasma density) and magnetic field, only certain polarizations of electromagnetic waves will propagate in a plasma. Others will be absorbed or reflected. The electromagnetic waves are required to propagate to the resonance zone. A wave launched from low density and at a low magnetic field can not propagate to the high density. It is essential that the microwaves enter the chamber at a high magnetic field.

Generally, different modes will be absorbed and/or reflected by the plasma differently. Launching of modes that are absorbed by plasma enhance the tuning as well. Based on the above, a launcher should 1) send the waves into the chamber at a field greater than that required for resonance; 2) obtain a propagation parallel to the magnetic field in regions of high density; and 3) launches the appropriate field distribution mode. Therefore, it would be advantageous to have an improved electron cyclotron resonance plasma-producing device with an improved launcher for directing microwave energy into plasma in a chamber at a high magnetic field.

SUMMARY OF THE INVENTION

The present invention provides a method and apparatus for combining the magnetic field generation and microwave coupling or launching functions required for directing electron cyclotron resonance plasma into a single structure. The magnetic field generation and field optimization functions as well as the microwave transmission line, coupling to the vacuum chamber, and microwave wave launch are accomplished in an integrated structure. A magnetic field is generated by a permanent magnet structure and the permanent magnet material comprises one or more surfaces of a waveguide structure. The waveguide structure functions as an impedance matching device and controls the field pattern of the launched microwave field to create a uniform plasma. The waveguide launcher may comprise a rectangular waveguide, a circular waveguide, or a coaxial waveguide with permanent magnet material forming the sidewalls of the guide and a magnetization pattern which produces the required microwave electron cyclotron resonance magnetic field, a region of field strength greater than the critical field into which the microwaves are launched into the vacuum chamber, a uniform field absorption pattern, and a rapid decay of the fields away from the resonance zone. In addition, the incorporation of permanent magnet material as a portion of the waveguide structure allows for a precisely controlled magnetic field configuration, and a reduction of the amount of permanent magnet material required.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION

Figure 1:
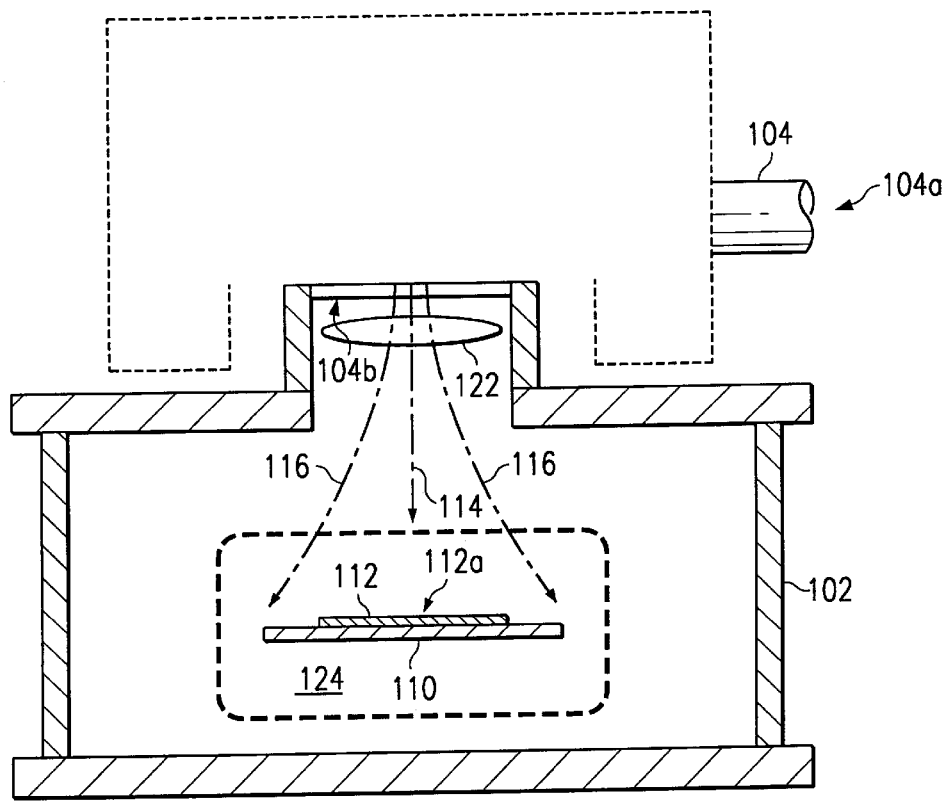
FIG. 1 is a cross-sectional view of a portion of a plasma-producing device in accordance with a preferred embodiment of the present invention.

With reference now to the figures, and in particular with reference to FIG. 1, a cross-sectional view of a portion of a plasma-producing device in accordance with a preferred embodiment of the present invention is depicted. For clarity, the components depicted are not drawn to scale and some elements of the total construction of a plasma-producing device are not depicted. Only so much of the structure as is necessary to understand the present invention is shown.

The plasma-producing device includes chamber 102 connected to a plasma source also referred to as launcher 104. Launcher 104 has an output 104b connected to chamber 102, which is an evacuable chamber. Launcher 104 is connected at an input 104a to a microwave power generation source and matching network (not shown) and conveys microwave energy produced by the generating source along its length to output 104b.

A support 110 located in the interior of evacuable chamber 102 holds workpiece 112 during processing, and may be electrically biased to create an electric field attracting plasma ions from the resonance zone. Microwave energy exits launcher 104 at output 104b and propagates, preferably in a circular transmission mode, within chamber 102 in direction 114 substantially perpendicular to the exposed processing surface 112a of workpiece 112. Close to the resonance zone, magnetic field lines 116 of the magnetic field generated by plasma source 104 are substantially aligned with the direction 114 of microwave energy propagation. That is, a line connecting the poles of the magnetic field is substantially aligned with, and along the same line as, the direction of propagation of the microwave energy. Microwave energy thus propagates from outlet 104b of launcher 104 in a direction aligned with a predominant axial magnetic field component produced by magnetic field source within launcher 104, which extends through launcher 104 and into chamber 102. A resonance zone is thus formed where the electric field associated with the microwave energy is in phase with the electron cyclotron motion of the plasma electrons.

In accordance with a preferred embodiment of the present invention, launcher 104 includes a waveguide and a permanent magnet combined in various configurations as described in further detail in the figures below. This permanent magnet is employed to generate a uniform plasma at the surface of workpiece 112. Electron cyclotron resonance (ECR) plasma resonance requires a magnetic field determined by the resonance condition $\omega = eB/m$, where $\omega$ is the angular frequency of the microwave energy ($2\pi f$, where $f$ is the frequency in Hertz), e is the well-known constant electronic charge (approximately $1.6 \times 10^{-19}$ C), B is the magnetic field strength in Gauss, and m is electron mass. For microwave energy at 2.45 GHz, a field strength of 875 G is required to create this resonance condition for electrons. Additionally, to achieve high ion density in the source and hence high ion currents at the workpiece, it is preferable to have a plasma density greater than the critical plasma density $n_c$ (an "overdense" plasma), where $n_c$ is defined by:

$$\omega = \frac{4\pi n_c e^2}{m}$$

where $\omega$ is the desired angular frequency for microwave energy to be coupled to the plasma (here, $2\pi \times 2.45$ GHz). For microwave energy with a frequency of 2.45 GHz, the resonance zone critical density is approximately $7 \times 10^{10}$ $cm^3$.

Unfortunately, electromagnetic (EM) waves, including microwaves, generally will not propagate through regions of plasma density greater than the critical density. Instead, microwaves are reflected by regions exceeding the critical density and thus will not reach the resonance zone. The consequence is that once the plasma density reaches the critical density, additional power cannot be added to the plasma and the density cannot be increased above the critical density. One exception to this general result is right hand circularly polarized waves, which may propagate through plasma regions exceeding the critical density provided the magnetic field strength is greater than that required for resonance. This is described in many works on plasma physics. In the case of microwave energy at 2.45 GHz as described earlier, this requires a magnetic field strength greater than 875 G. By achieving the launch condition of magnetic field strength in excess of that required for resonance with microwave energy of a given frequency, referred to as high field injection, a resonance zone with a plasma density greater than the critical density may be formed within evacuable chamber 102. High field injection is therefore a critical aspect of plasma source and launcher design.

Plasma uniformity is desirable in most plasma processing systems. There are two general sources of plasma nonuniformity: (1) nonuniformity in the absorption or plasma generating region; and (2) nonuniformity in the transport or movement of the plasma between the generation zone and the workpiece. Uniformity of plasma generation requires that a uniform absorption be achieved, including a uniform microwave field pattern and a uniform magnetic field (resonance zone) or some combination of non-uniformities, leading to a uniform absorption. Since the absorption and field patterns are interrelated, the ability to manipulate and control the magnetic field configurations (position of the resonance zone and local curvature of the resonance zone shape) on a local scale is critical to achieving a highly uniform absorption. "Local scale" refers to lengths smaller than the characteristics size of the permanent magnet. The magnetic field varies relatively slowly across lengths smaller than the characteristic size. The present invention provides a launcher that incorporates a magnetic source, which is a permanent magnet in the depicted example.

In practice, it may be extremely difficult to generate a perfectly uniform plasma. Thus, some degree of homogenization of the plasma between the source and the workpiece would be desirable. This would allow local nonuniformities in the source to diffuse out, thus "smearing out" any non-uniformities present in the source region. In a magnetized plasma, however, diffusion of charged particles may be influenced substantially by the magnetic field. In particular, diffusion perpendicular to the magnetic field lines is slowed proportionally to the inverse square of the magnetic field strength. Due to this, it is desirable to achieve as low a magnetic field as possible in the region between the plasma generation (resonance) zone and the workpiece.

Plasma variations at the workpiece may also arise from spatial variations in the divergence of the magnetic field. In a collisionless plasma (no cross field diffusion), plasma will travel down the magnetic field lines to the workpiece and the plasma density at any point will be proportional to the field strength at that point and the density at the corresponding position in the source. Assuming the plasma is generated uniformly at the resonance zone (875 G), the plasma density at a point where the field strength is 87.5 Gauss would be $\frac{1}{10}$th that achieved at the resonance zone. If the field strength across the workpiece varies, the plasma density will vary commensurately given a uniform density in the resonance zone. At lower magnetic fields, cross field diffusion will be enhanced and the effects of magnetic field strength variations will be minimized. Thus, lower magnetic fields between the plasma generation zone and the workpiece, together with a controlled divergence of the field lines, is desirable.

Qualitatively, both electromagnets and permanent magnets have a dipole character at distances greater than the characteristic length scale of the magnet (radius for coil electromagnet, width dimensions for a permanent magnet. The crossover to a low field region thus depends on the magnet field source geometry.

Permanent magnet sources provide some advantage in achieving plasma process uniformity by a dense plasma region followed by a low field region. The lateral dimension of a permanent magnet is somewhat smaller than the lateral dimension of an electromagnet having corresponding strength (typically about 4–6 inches in diameter), so that the cross-over to the dipole field regime in the far field occurs somewhat closer to the magnet. Coupling of the microwave energy to a region of magnetic field strength of at least that required for resonance, therefore may occur in the near field, but not directly at the face. The magnetic field should thus fall from fairly high values, approximately 3000–5000 G, to a much smaller field strength at the working surface 112a of workpiece 112. For magnetic field strengths of about 50–100 G at workpiece 112, the gyro radius of a 3 electron-volts (eV) electron is 1 mm and the magnetic field still has a substantial effect on diffusion of the electron. If the magnetic field strength is lowered to 5 G, the gyro radius increases to 1 cm and the magnetic field has less effect. The larger gyro radius results in better diffusion and better plasma uniformity.

A magnetic bucket or multi-polar confinement bucket enhances the uniformity by reducing the stray fields. This can be accomplished by engineering various magnetic structures. Practically this is more easily accomplished when the resonance zone is close to the magnet. The present invention provides an apparatus in which the magnet is placed closer to the resonance zone through an improved launcher. The present invention provides launchers including microwave guides and permanent magnets for use in an electron cyclotron resonance plasma-producing device. Various structures for systems that lead to deposition of microwave absorbing films on the vacuum window are described. Illustrations are provided for structures in which the microwave window is placed in a remote location to minimize deposition on the window. Alternatively, methods of configuring the location of the resonance zone so that films depositing on the microwave window are removed, either during normal operation, or by manipulation of the location of the resonance zone during a "cleaning" process.

Figure 2A:
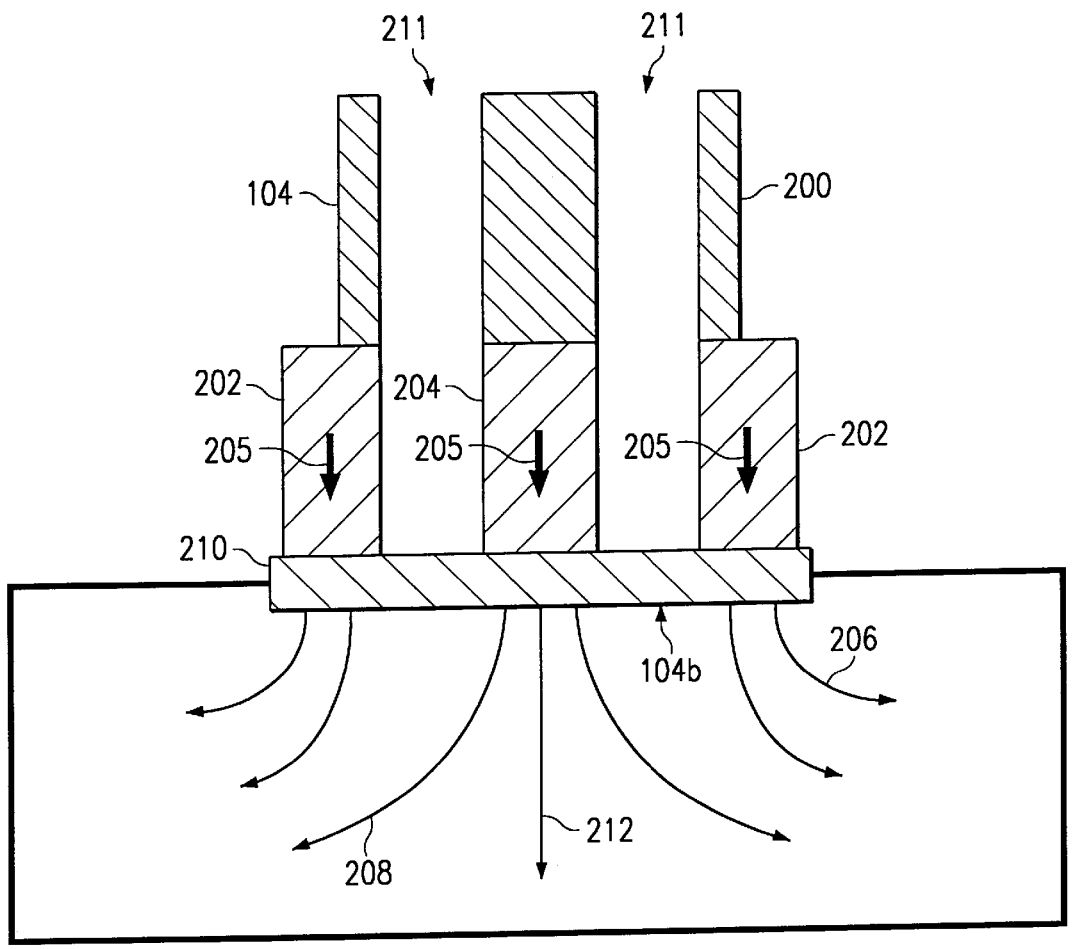
FIGS. 2A and 2B depict a launcher with a coaxial waveguide having an input or inlet.
Figure 2B:
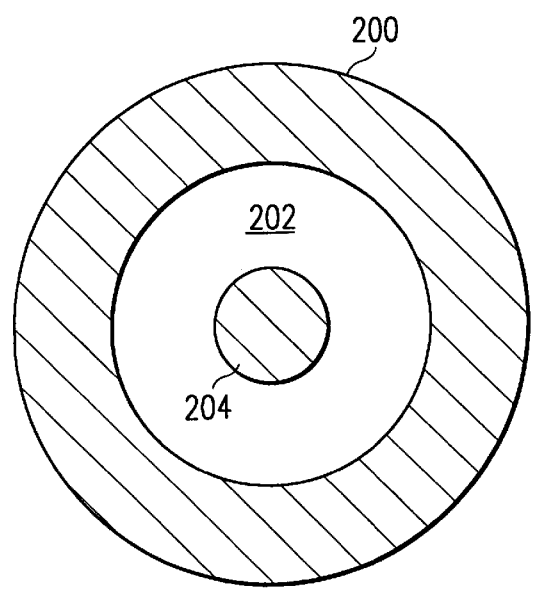

Turning now to FIG. 2A, a launcher including a coaxial waveguide is depicted in accordance with a preferred embodiment of the present invention. Launcher 104 contains a coaxial waveguide 200 with input 104a connected to a microwave source (not shown). FIG. 2B depicts a cross section of coaxial waveguide 200. Coaxial waveguide 200 in launcher 104 includes permanent magnets 202 and 204. These permanent magnets form the outer conductor and the inner conductor in which magnet 202 forms the outer conductor of coaxial waveguide 200 in launcher 104;and magnet 204 forms the inner conductor of coaxial waveguide 202 in launcher 104. Permanent magnets 202 and 204 generate magnetism in direction 205. In this example, permanent magnet material, forming permanent magnets 202 and 204, actually form the sidewalls of the waveguide structure. In practice, it may be more appropriate to provide a high conductivity coating or inner surface, which is thick relative to the skin depth for microwaves, but thin relative to the magnet dimensions. Permanent magnets 202 and 204 have a magnetization orientation, which provides the requisite field for electron cyclotron resonance. In a preferred embodiment, as in FIG. 2A, the physical location of permanent magnets 202 and 204 close to electron cyclotron resonance region 206 within chamber 102 reduces the amount of magnetic materials required to produce magnetic field 208.

Launcher 104 also includes a microwave window 210, which is located at output 104b of launcher 104. Microwave window 210 is a vacuum window, which is transparent to microwave energy in the depicted example. In this example, microwave window is located at output 104b and provides a barrier to create a vacuum in chamber 102. Region 211 is not a vacuum region and in the depicted example is at an atmospheric pressure. Microwave window 210 is passes microwave energy and is used to introduce microwave energy from a source, which is typically at atmospheric pressure, to a plasma in chamber 102, which is typically in a vacuum. In the depicted example, microwave window 210 is a quartz window although other materials may be used that allow passage of microwave energy, but maintain a vacuum for chamber 102 at output 104b of launcher 104. Some other materials that may be used for microwave window 210 include, for example, without limitation, sapphire, alumina, or aluminum oxide. Microwave window 210 also may serve as a matching device between coaxial waveguide 200 and chamber 102. The source injects the transverse electromagnetic mode in coaxial waveguide 202 that launches a circularly symmetrical microwave field in direction 212 into chamber 102, which is a circular vacuum vessel in the depicted example.

Figure 3A:
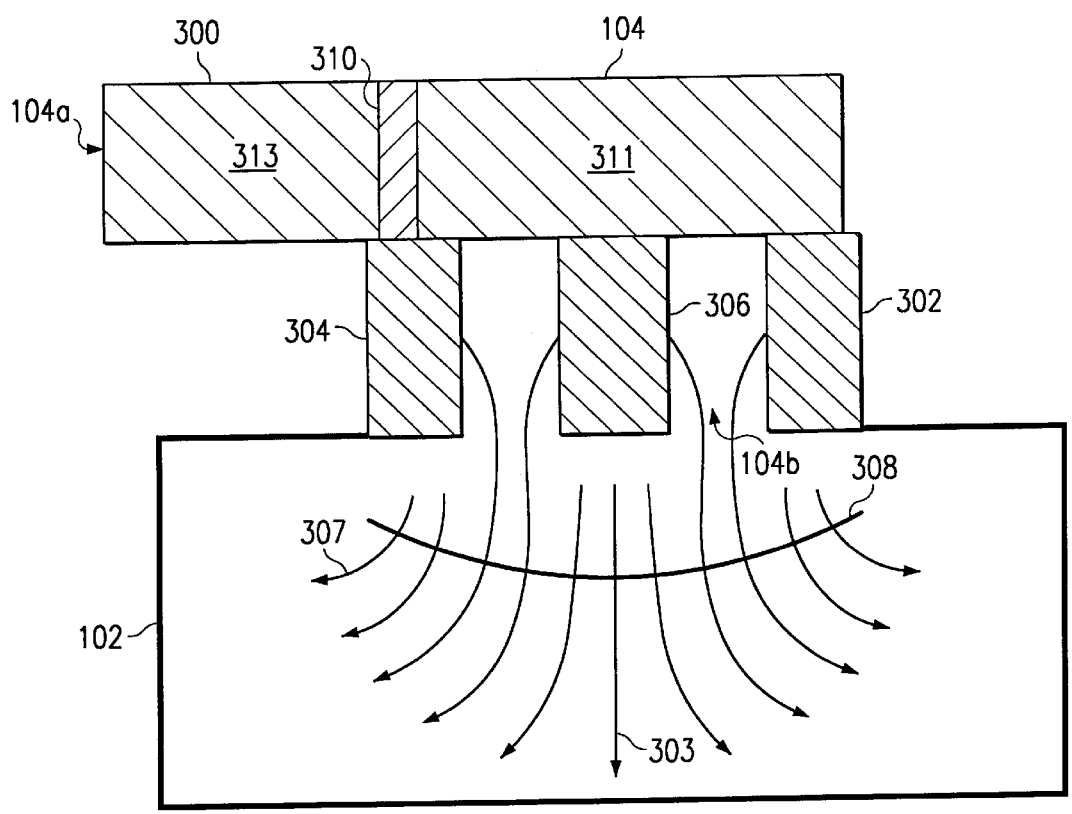
FIGS. 3A and 3B are coaxial launchers with rectangular waveguide coupled to coaxial waveguide in accordance with a preferred embodiment of the present invention.
Figure 3B:
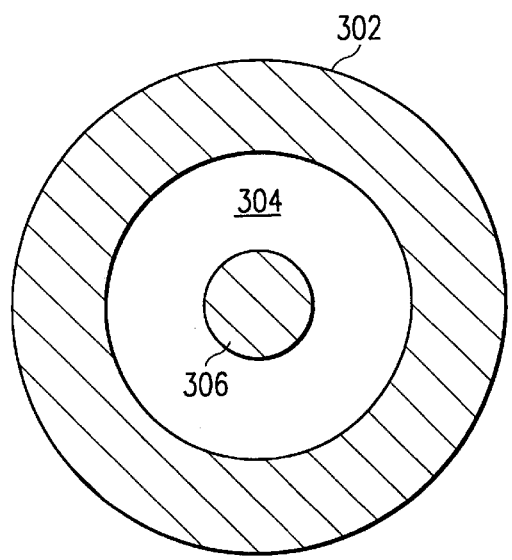

Next with reference to FIGS. 3A and 3B, a coaxial launcher with a rectangular waveguide coupled to coaxial waveguide is illustrated in accordance with a preferred embodiment of the present invention. In FIG. 3A, launcher 104 includes a rectangular waveguide 300 coupled to a coaxial waveguide 302. A cross-sectional view of coaxial waveguide 302 is illustrated in FIG. 3B. Launcher 104 includes permanent magnets 304 and 306 with a cross-sectional view of launcher 104. The output ports of high power microwave sources are usually in the form of rectangular waveguides. Transmission losses through rectangular waveguides are much lower than through a coaxial waveguide that is operating in the transverse electromagnetic mode. Efficient excitation of a coaxial launcher is facilitated by a rectangular waveguide. Launcher 104 in the depicted example has input 104a of rectangular waveguide 300 in launcher 104 connected to the source. The microwave energy is directed through rectangular waveguide 300 to coaxial waveguide 302 for transmission along direction 303 into chamber 102, which is a circular chamber in the depicted example.

Permanent magnets 304 and 306 generate magnetic field 307. These magnets are arranged to keep the field strength greater than 875 G up to 875 G resonance zone 308 within chamber 102. Microwave window 310 is located between input 104a and output 104b in launcher 104. This window may be used to form a vacuum region 311 located between microwave window 310 and output 104b. Region 313 is not under a vacuum in this example. This window provides a barrier to gases from passing into or out of chamber 102. Microwave window 310 is located in a remote location from chamber 102. Microwave window 310 is position such that a line of sight access from to the microwave window 310 from chamber 102. This positioning of microwave window 310 near input 104a within rectangular waveguide 300 in launcher 104 reduces deposition of materials on microwave window 310 during deposition and etching processes performed within chamber 102. In addition, depletion of microwave window 310 is reduced during etching processes within chamber 102.

Figure 4:
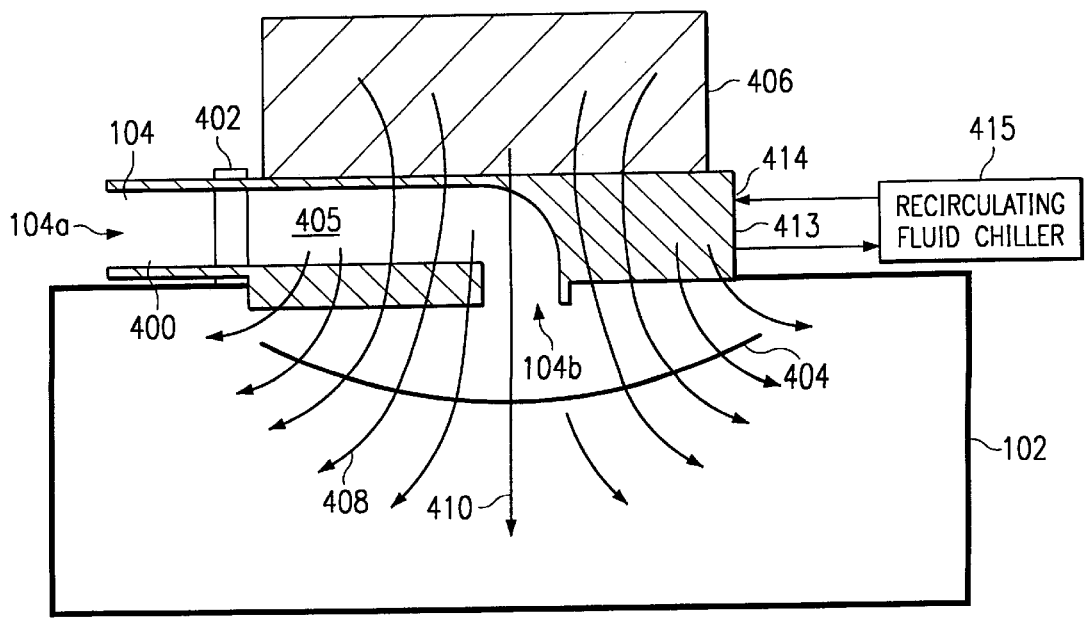
FIG. 4 depicts a launcher with a vacuum rectangular waveguide in accordance with a preferred embodiment of the present invention.

Turning now to FIG. 4, a launcher with a vacuum rectangular waveguide in accordance with a preferred embodiment of the present invention. Launcher 104 in this example includes rectangular waveguide 400 machined into a cooled housing 414. A microwave window 402 in launcher 104 is remotely located away from resonance zone 404, which is an 875 G resonance zone. Microwave window 402 provides a barrier to gases while allowing microwave energy to pass. Microwave window 402 and output 104b define vacuum region 405 within rectangular waveguide 400.

A permanent magnet 406 is located over rectangular waveguide 400 and is used to generate magnetic field 408. Microwave energy is directed into chamber 102 along direction 410. The magnetic field strength of magnetic field 408 is maintained at a level greater than 875 G in vacuum region 405 of rectangular waveguide 400 prior to being launched into the resonance vessel. Microwave window 402 is such that a line of sight access to chamber 102 is absent. The advantage of this launcher configuration is the remote location of microwave window 402 is such that deposition on the window is minimized.

Further, a cooling system 413 is used to cool launcher 104. Cooling system 413 includes a recirculating fluid chiller 415, which circulates cooled fluid through passages within housing 414. This system allows for controlled temperature on the launcher surfaces and a reduced possibility of arcs and particle generation.

Figure 5A:
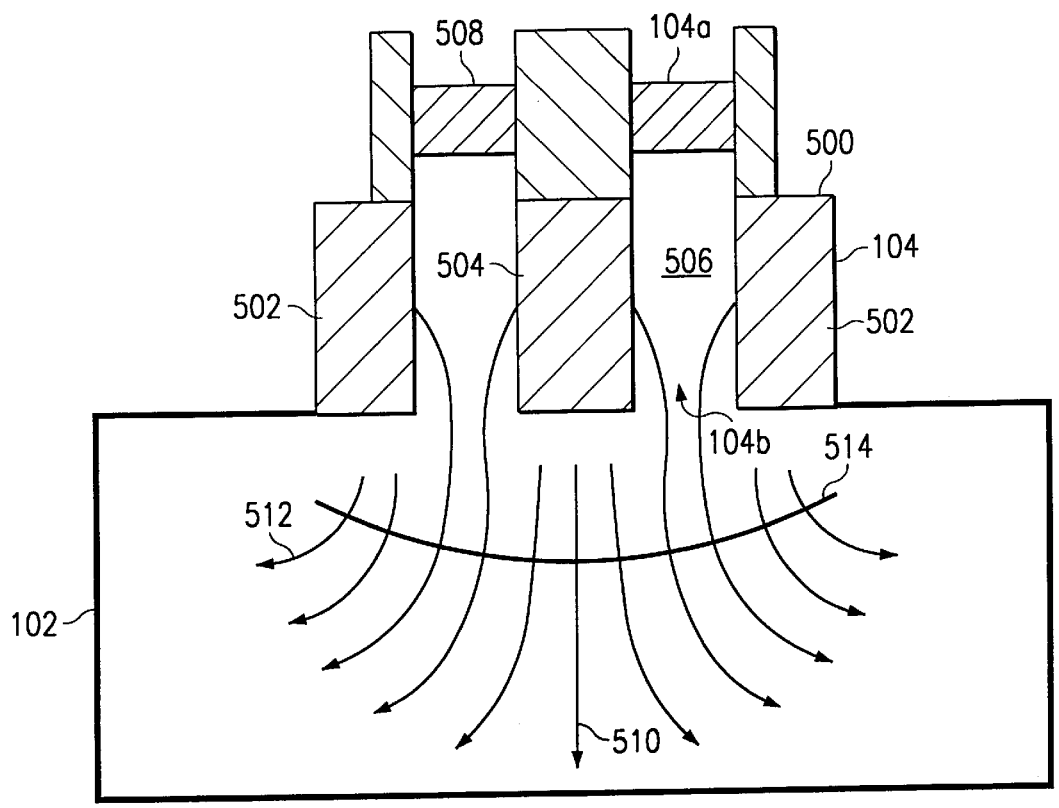
FIGS. 5A and 5B are illustrations of a launcher including vacuum coaxial waveguide in accordance with a preferred embodiment of the present invention.
Figure 5B:
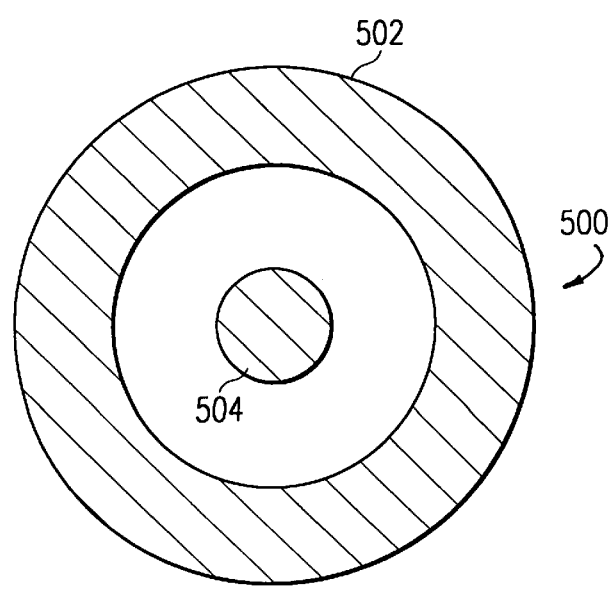

With reference now to FIGS. 5A and 5B, illustrations of a vacuum coaxial waveguide coupled in vacuum to a rectangular waveguide are depicted in accordance with a preferred embodiment of the present invention. In FIGS. 5A and 5B, launcher 104 includes a coaxial waveguide 500 in which permanent magnets are incorporated as part of coaxial waveguide 500. In particular, coaxial waveguide 500 includes permanent magnet 502 and permanent magnet 504. As can be seen in FIG. 5B, permanent magnet 502 forms an outer conductor while permanent magnet 504 forms an inner conductor of coaxial waveguide 500. A vacuum region 506 is formed within coaxial waveguide 500 using microwave window 508 near input 104a of launcher 104. Microwave energy is directed through vacuum window 508 into chamber 102 through output 104b in direction 510. Magnets 502 and 504 generate magnetic field 512, which is launched into resonance zone 514, an 875 G resonance zone, in chamber 102. This configuration of launcher 104 places permanent magnets closer to chamber 102 reducing the amount of the permanent magnet required to generate the desired magnetic field.

Figure 6A:
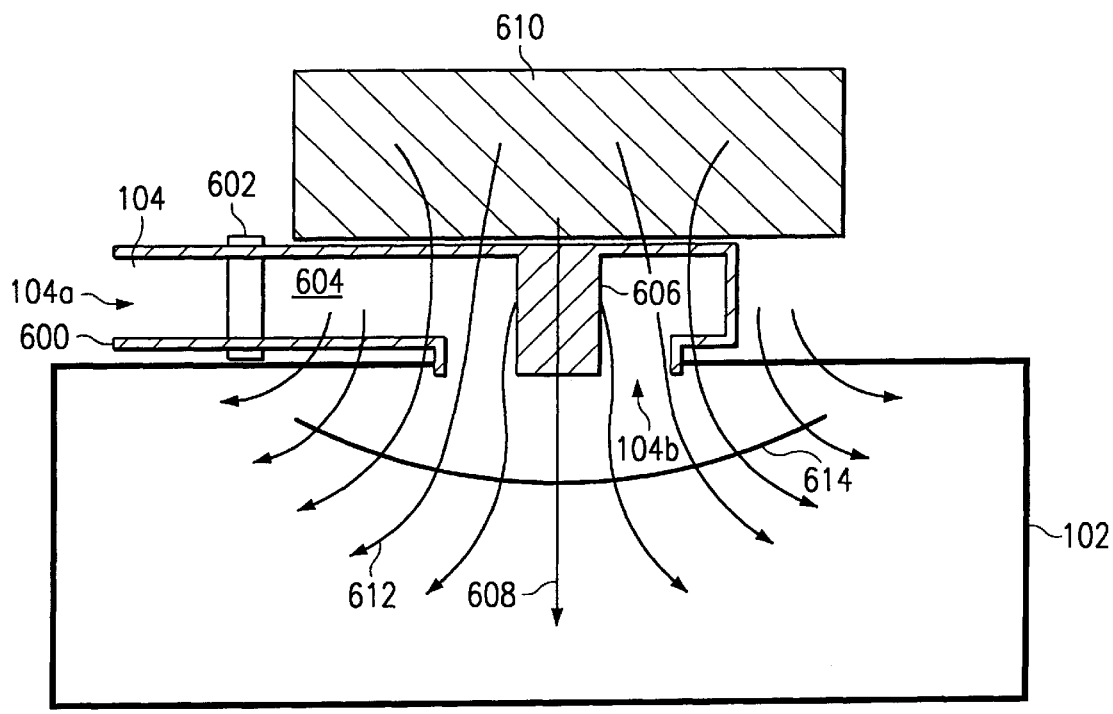
FIGS. 6A and 6B are launchers with a mode converter in accordance with a preferred embodiment of the present invention.
Figure 6B:
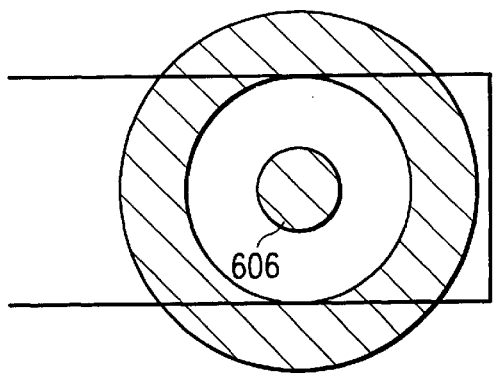

With reference now to FIGS. 6A and 6B, a launcher with a mode converter is depicted in accordance with a preferred embodiment of the present invention. In this embodiment, launcher 104 includes a rectangular waveguide 600 with a microwave window 602, which defines vacuum region 604 of rectangular waveguide 600. Rectangular waveguide 600 also includes a cylindrical stub coupler 606 in vacuum region 604. Stub coupler 606 may be constructed from permanent magnetic material. Microwave energy is directed from a source through input 104a through rectangular waveguide 600 to output 104b in direction 608 into chamber 102. Launcher 104 also includes a permanent magnet 610, which is located above launcher 104. Permanent magnet 610 generates magnetic field 612, which is launched into resonance zone 614, which is an 875 G resonance zone in the depicted example. This configuration of launcher 104 provides an advantage in that microwave window 602 is placed in a location that reduces deposition of materials on microwave window 602 during deposition processes and the depletion of microwave window 602 during etching processes. Specifically, microwave window 602 is located within launcher 104 such that a line of sight access to chamber 102 is absent.

Figure 7A:
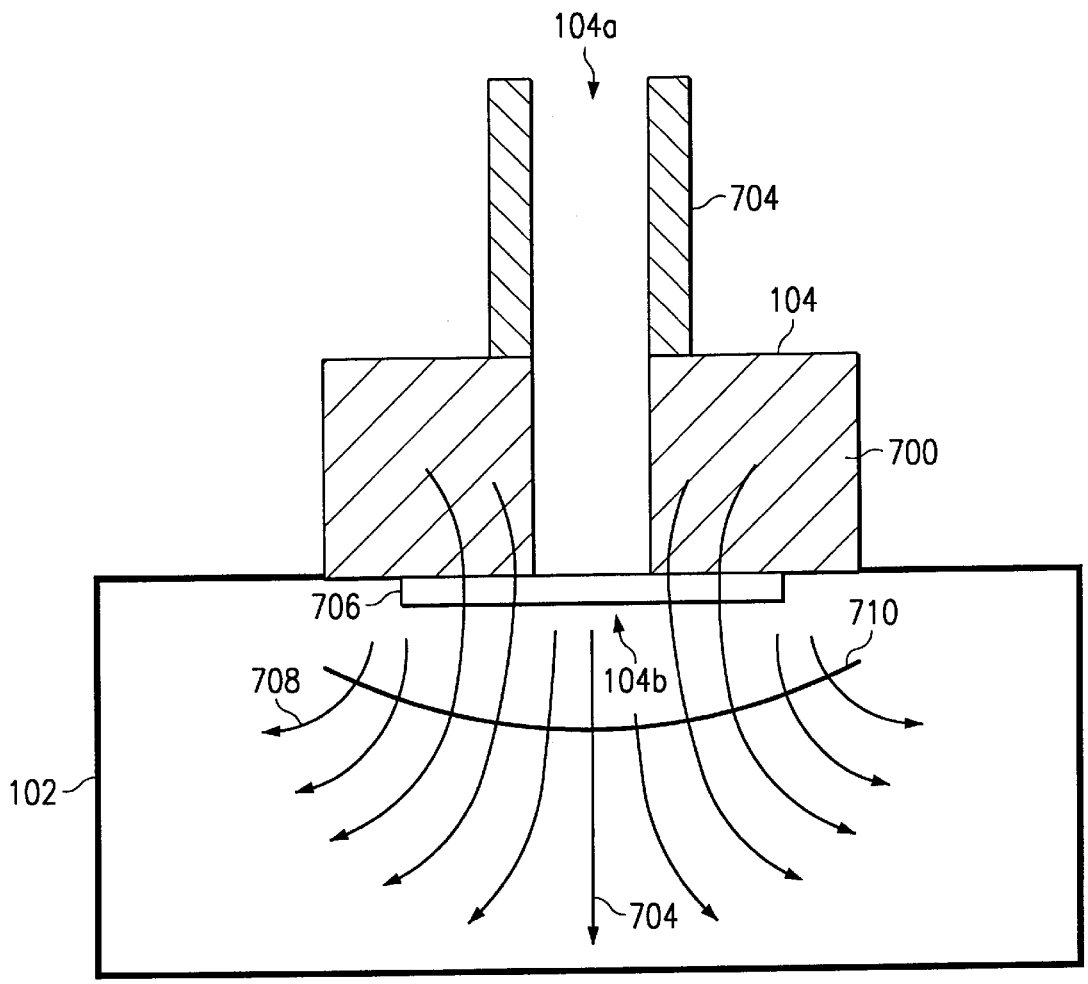
FIGS. 7A and 7B are launchers with a rectangular waveguide in accordance with a preferred embodiment of the present invention.
Figure 7B:
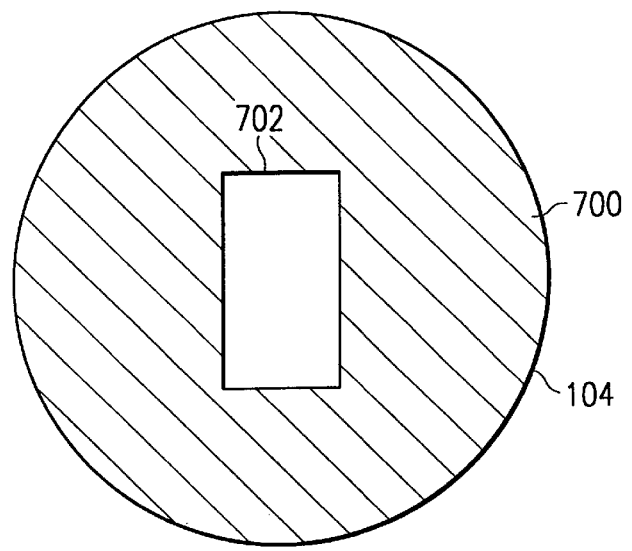

Turning now to FIGS. 7A and 7B, a launcher with a rectangular waveguide is depicted in accordance with a preferred embodiment of the present invention. In FIGS. 7A and 7B, launcher 104 includes a permanent magnet 700 with a rectangular waveguide 702 connected to permanent magnet 700. Alternatively, waveguide 702 may be inserted into permanent magnet 700, such that waveguide 702 forms an inner wall in permanent magnet 700. Microwave energy is directed through input 104a to output 104b in direction 704 into chamber 102. A microwave window 706 is located at output 104b of launcher 104. Permanent magnet 700 generates a magnetic field 708, which is launched through output 104b into resonance zone 710, which is an 875 G resonance zone in the depicted example. In this configuration, the amount of magnetic material required to generate the desired magnetic fields is reduced.

Figure 8A:
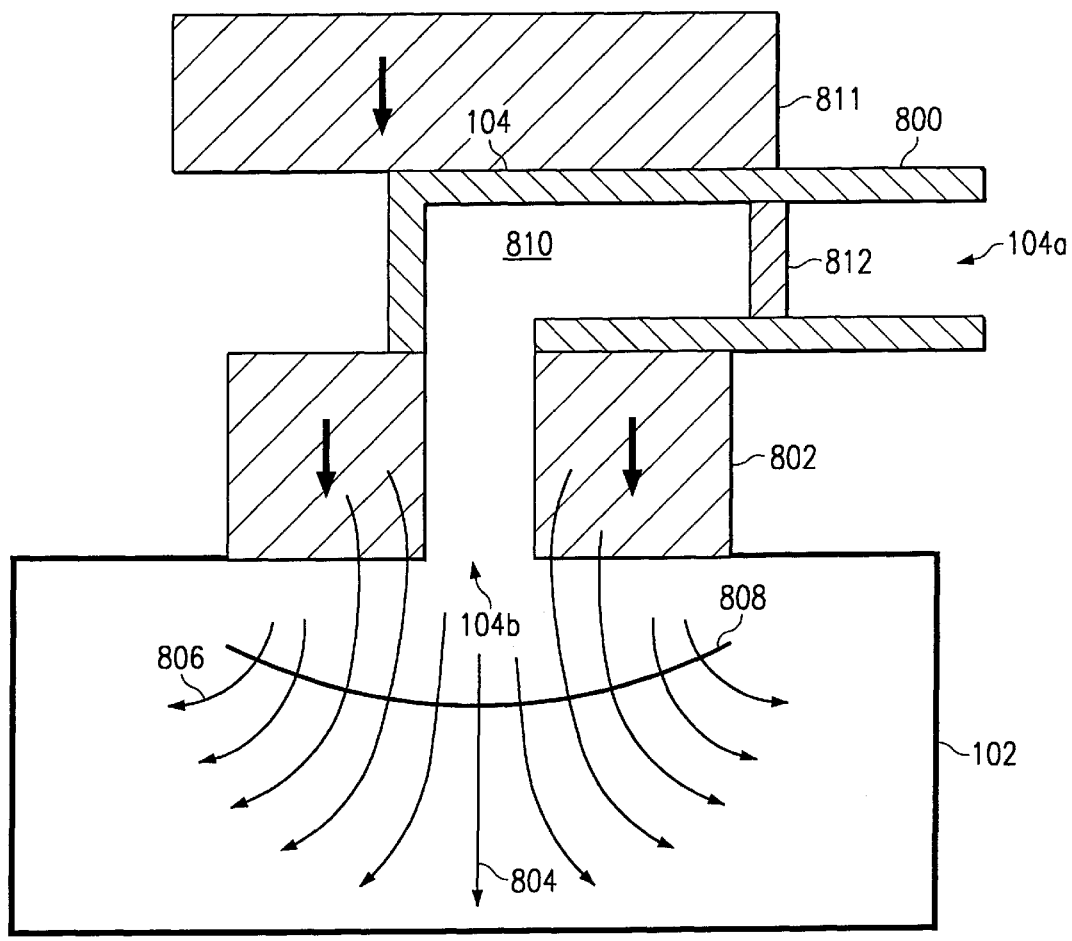
FIGS. 8A and 8B are launchers with a vacuum waveguide inserted through a magnet in accordance with a preferred embodiment of the present invention.
Figure 8B:
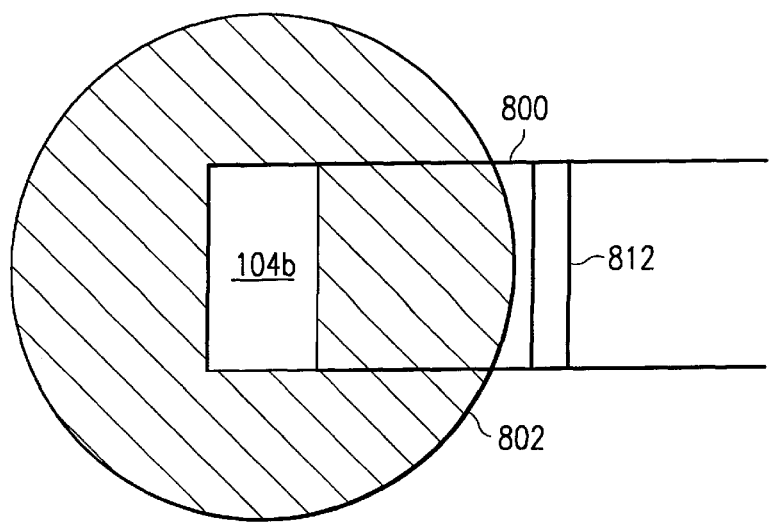

With reference now to FIGS. 8A and 8B, a launcher with a vacuum waveguide through magnet is depicted in accordance with a preferred embodiment of the present invention. Launcher 104 includes a rectangular waveguide 800 inserted through permanent magnet 802 in which microwave energy is directed through input 104a to output 104b into chamber 102 in direction 804. Permanent magnet 802 generates magnetic field 806 that is launched into resonance zone 808, which is an 875 G resonance zone in the depicted example. Rectangular waveguide 800 and launcher 140 includes vacuum region 810 within launcher 104, which is defined by microwave window 812 and output 104b. Optionally a permanent magnet 811 may be added within to launcher 104. Permanent magnet 811 is placed in contact rectangular waveguide 800. The configuration of rectangular waveguide 800 through permanent magnet 802 reduces the amount of magnetic material required to generate desired magnetic field 806. In addition, this configuration also provides an advantage in which microwave window 812 is in a remote location relative to chamber 102 such that deposition of materials on the window is reduced along with minimizing etching through exposure to plasma processing occurring within chamber 102.

Figure 9A:
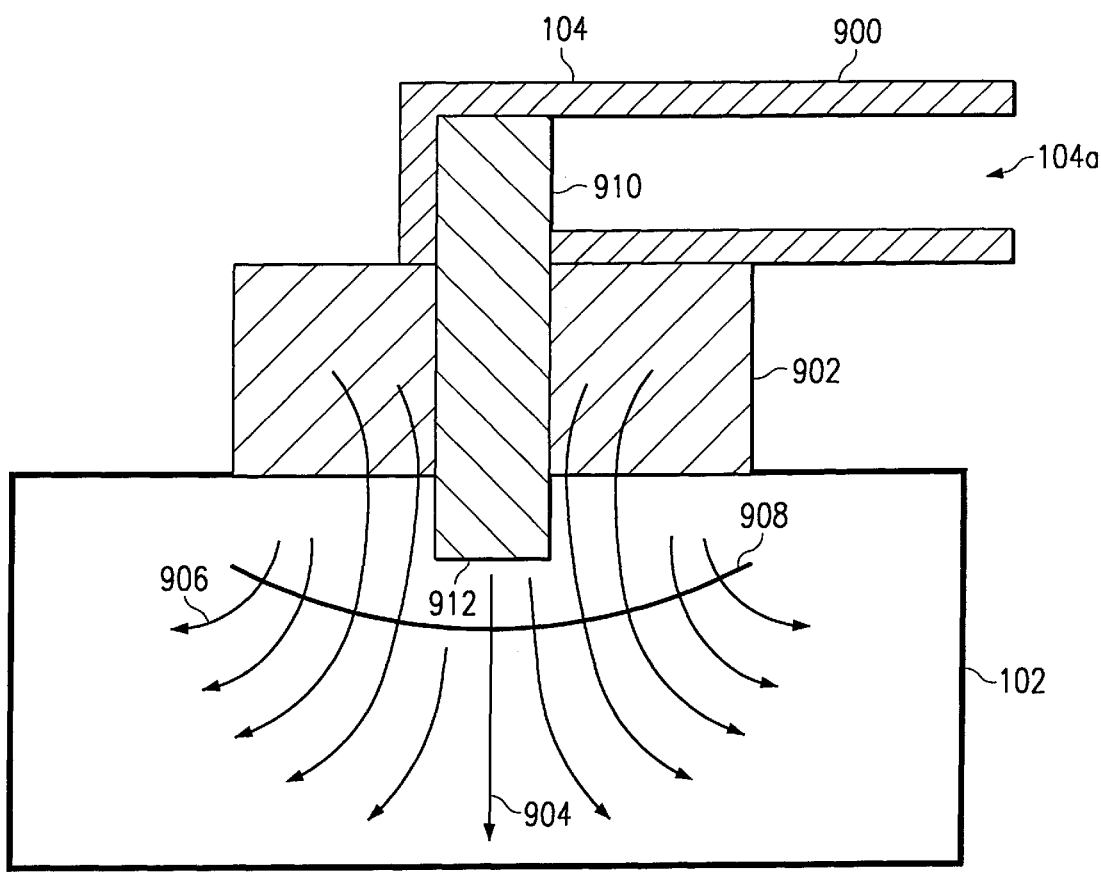
FIGS. 9A and 9B are launchers including a rectangular waveguide having a dielectric waveguide portion in accordance with a preferred embodiment of the present invention.
Figure 9B:
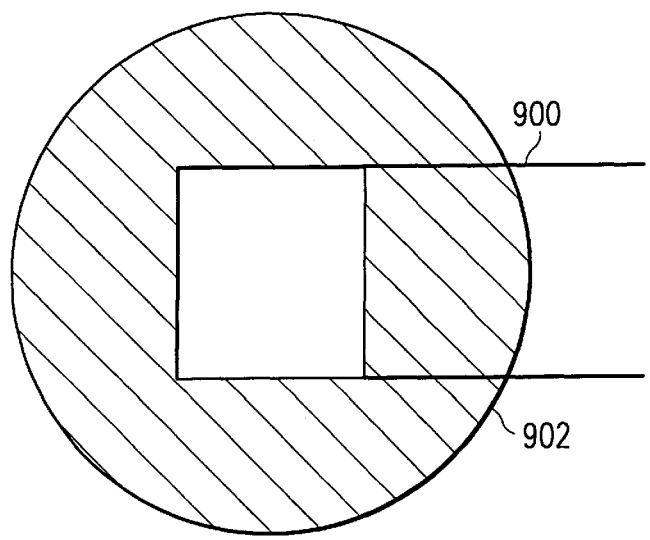

With reference next to FIGS. 9A and 9B, a launcher including a rectangular waveguide having a dielectric waveguide portion is depicted in accordance with a preferred embodiment of the present invention. In FIGS. 9A and 9B, launcher 104 includes a rectangular waveguide 900 inserted through a permanent magnet 902 in which microwave energy is directed through input 104a to output 104b into chamber 102 in direction 904. Permanent magnet 902 generates a magnetic field 906, which is launched into resonance zone 908, which is an 875 G resonance zone in the depicted example. A dielectric waveguide portion 910 is found within rectangular waveguide 900. Tip 912 of dielectric waveguide portion 910 may be shaped to enhance coupling of desired modes into plasma within chamber 102. Dielectric waveguide portion 910 may be rectangular or circular. Rectangular to dielectric coupler 911 may include a mode converter to excite the preferred mode within the dielectric (e.g., a right circular polarized mode). A material such as alumina with a high index will decrease the diameter required to support a particular mode. In the depicted example, dielectric waveguide portion 910 renders the use of a microwave window unnecessary within launcher 104. The insertion of rectangular waveguide through permanent magnet 902 provides a configuration in which the amount of magnetic material required for permanent magnet 902 is reduced.

Thus, the present invention provides an improved method and apparatus for producing a uniform plasma within a vacuum chamber. The present invention provides this advantage using a launcher that includes a waveguide structure and magnetic material incorporated within the waveguide structure or in close proximity to the waveguide structure, reducing the amount of magnetic material needed to generate the desired magnetic fields for use in a vacuum chamber for deposition and etching processes involving plasma. The present invention includes an added advantage in which a microwave window may be placed within the launcher in a fashion that reduces deposition of materials on the microwave window during deposition processes and reduces etching of the window during etching processes within the vacuum chamber.

The present invention includes an advantage in that deposition and/or etching of the microwave vacuum window may be controlled by several techniques described in the depicted examples. One techniques includes positioning of the window out of the line of sight of the processing chamber and plasma generation region such that the probability of a deposition or window etch species reaching the window is greatly reduced. This possibility is covered in the examples in FIGS. 3–6 and 8. In this approach, plasma is prevented from being generated in the area immediately adjacent to the window. The magnetic field is generated above that required for resonance in the region through the use of permanent magnets that substantially form one or more surfaces of the waveguide in the depicted examples. This allows the high magnetic fields to be generated without excessive cost in magnetic materials. In another techniques, the window may be maintained clean during operation of the system through proper design of the magnetic fields and location of the resonance zone such as to provide for sufficient ion bombardment to remove any deposition which occurs during operation by a process, such as sputter etching. The relative sputter etch may be manipulated for a given operating regime by controlling the spacing between the resonance zone and the window such as to provide the appropriate degree of ion bombardment. With smaller spacing, higher ion currents will flow to the window surface, while with larger spacing, smaller ion currents will reach the window.

The description of the present invention has been presented for purposes of illustration and description, but is not limited to be exhaustive or limited to the invention in the form disclosed. Many modifications and variations will be apparent to those of ordinary skill in the art. A permanent magnet is a material with an oriented macroscopic magnetization. The embodiment was chosen and described in order to best explain the principles of the invention the practical application to enable others of ordinary skill in the art to understand the invention for various embodiments with various modifications as are suited to the particular use contemplated.

What is claimed is:

1. An apparatus comprising:
   a vacuum processing chamber;
   a waveguide structure having an input and an output, wherein the output is connected to the vacuum processing chamber;
   a vacuum window located within the waveguide structure between the input and the output of the waveguide structure and defines a vacuum region in the waveguide structure located between the vacuum window and the output, wherein the vacuum window is transparent to electromagnetic radiation;
   a plasma generation region, wherein a discharge occurs in the plasma generation region;
   a plasma processing region, wherein the plasma processing region is fed by the discharge created in the plasma generation region;
   a permanent magnet structure, wherein the permanent magnet structure forms a magnetic field in the vacuum chamber, which is magnetized to produce a magnetic field substantially parallel to the direction of propagation of electromagnetic radiation and which diverges in field strength in the direction of propagation; forms a magnetic field intensity and contour for electron cyclotron resonant absorption of electromagnetic radiation within the vacuum chamber; and
   which substantially forms at least one surface of the waveguide structure.

2. The apparatus of claim 1, wherein the waveguide structure is a coaxial waveguide having outer and inner conductors, wherein at least one of the conductors is substantially formed from a permanent magnetic material and wherein the permanent magnetic material terminates at the vacuum window.

3. The apparatus of claim 2, wherein the portion of the waveguide containing the permanent magnetic material is located in the vacuum region in the waveguide structure.

4. The apparatus of claim 1, wherein the waveguide structure is a rectangular waveguide having walls substantially formed from a permanent magnetic material, wherein the permanent magnetic material is located between the vacuum window and the output.

5. The apparatus of claim 1, wherein the waveguide structure is a circular waveguide having walls substantially formed from a permanent magnetic material.

6. The apparatus of claim 1, wherein the waveguide is configured to eliminate a line of sight access to the vacuum processing chamber from the microwave window.

7. The apparatus of claim 1, wherein the waveguide structure further includes a mode converter configured to propagate a preferred mode into the plasma and the permanent magnet structure forms at least one surface of the waveguide structure and the mode converter structure.

8. An apparatus for directing electromagnetic energy comprising:
   a waveguide structure, having an input and an output, wherein the input is configured to receive the electromagnetic energy from a source and the output is configured to direct the electromagnetic energy; and
   a magnetic material incorporated as part of the waveguide structure, wherein the magnetic material provides a magnetic field used for electron cyclotron resonance.

9. The apparatus of claim 8, wherein the waveguide structure includes a cavity and further comprising:
   a window separating the cavity into two portions, wherein the window passes the electromagnetic energy.

10. The apparatus of claim 8, wherein the electromagnetic energy is microwave energy.

11. The apparatus of claim 10, wherein the magnetic material is a permanent magnetic material.

12. The apparatus of claim 8, wherein the waveguide structure is a rectangular waveguide structure.

13. The apparatus of claim 8, wherein the waveguide structure is a coaxial waveguide structure.

14. The apparatus of claim 8, wherein the waveguide structure is a circular waveguide structure.

15. The apparatus of claim 8, wherein the waveguide structure includes a mode converter, wherein the mode converter results in a selected wave mode being generated at the output of the waveguide structure.

16. The apparatus of claim 10, wherein the electromagnetic energy is microwave energy having a frequency of is at 2.45 GHz and the magnetic material is a permanent magnetic material generating a magnetic field strength greater than 875 G such that a resonance zone is formed within the plasma generation region.

17. A launcher for directing microwave energy into a chamber containing plasma, the launcher comprising:
   a waveguide structure having a cavity with an input at a first end of the cavity add an output at the second end of the cavity, wherein the input is configured to receive the microwave energy and the output is configured for connection to the chamber containing plasma; and
   a permanent magnetic material incorporated as a part of the waveguide structure.

18. The apparatus of claim 17, wherein the waveguide structure is a rectangular waveguide structure.

19. The apparatus of claim 17, wherein the waveguide structure is a coaxial waveguide structure.

20. The apparatus of claim 17, wherein the waveguide structure is a circular waveguide structure.

21. The apparatus of claim 17, wherein the waveguide structure includes a mode converter, wherein the mode converter results in a selected wave mode being generated at the output of the waveguide structure.

22. The apparatus of claim 17, wherein the waveguide structure includes a cavity and further comprising:
   a window separating the cavity into two portions, wherein the window passes the electromagnetic energy.

23. An apparatus for processing semiconductors comprising:
   a chamber, wherein the chamber includes, wherein a vacuum may be introduced into the chamber;
   a support, wherein the support holds a workpiece during processing of the workpiece;
   a launcher having an input and an output, the input being configured for connection to a microwave source, the output being coupled to the chamber, and the launcher including;
   a waveguide structure, and the waveguide has a cavity with a first end connected to the input of the launcher and a second end connected to the output of the launcher; and
   a permanent magnetic material, wherein the permanent magnetic material is incorporated as part of the waveguide structure,
   wherein the launcher directs microwave energy into the chamber through the output of the launcher.

24. The apparatus of claim 23, wherein the launcher further includes a window located at the second end of the waveguide structure, wherein the window passes microwave energy.

25. The apparatus of claim 23, wherein the launcher further includes a window located within the waveguide structure, wherein the window passes microwave energy and a vacuum waveguide structure is formed.

26. The apparatus of claim 25, wherein the window is constructed from a material selected from a group consisting of quartz, sapphire, alumina, or aluminum oxide.

27. The apparatus of claim 26, wherein the window is used to maintain a vacuum within the chamber.

28. The apparatus of claim 23, wherein the microwave energy has a frequency of 2.45 GHz and the permanent magnetic material generates a magnetic field strength greater than 875 G such that a resonance zone is formed within the chamber.

29. The apparatus of claim 23, wherein the waveguide structure is a coaxial waveguide structure.

30. The apparatus of claim 23, wherein the waveguide structure is a circular waveguide structure.

31. The apparatus of claim 23, wherein the waveguide structure includes a mode converter, wherein the mode converter results in a selected wave mode being generated at the output of the waveguide structure.

32. A launcher for directing microwave energy into a chamber containing plasma, the launcher comprising:
a coaxial waveguide structure having an inner conductor, an outer conductor and a cavity between the inner conductor and the outer conductor, wherein the coaxial waveguide having an input at a first end of the cavity and an output at the second end of the cavity, and further wherein the input is configured to receive the microwave energy and the output is configured for connection to the chamber containing plasma; and
a permanent magnetic material incorporated as a part of the coaxial waveguide structure, wherein the permanent magnet material is oriented such that a magnetic field generated from the permanent magnetic material is substantially parallel to a direction of a microwave propagation vector.

33. The launcher recited in claim 32 further comprises:
a microwave vacuum window affixed to the input at the first end of the cavity and defines a vacuum region in the coaxial waveguide structure located between the microwave vacuum window and the chamber containing plasma.

34. The launcher recited in claim 32 further comprises:
a microwave vacuum window affixed to the output at the second end of the cavity and defines a vacuum region in the chamber containing plasma.

35. The launcher recited in claim 32 wherein the outer conductor is not the permanent magnetic material incorporated as a part of the coaxial waveguide structure.

36. The launcher recited in claim 32 wherein the inner conductor and the outer conductor are the permanent magnetic material incorporated as a part of the coaxial waveguide structure.

37. The launcher recited in claim 32 wherein at least a portion of the inner conductor and at least an equal portion of the outer conductor are the permanent magnetic material incorporated as a part of the coaxial waveguide structure.

38. The launcher recited in claim 32 wherein at least a portion of the inner conductor is the permanent magnetic material incorporated as a part of the coaxial waveguide structure.

39. A launcher for directing microwave energy into a chamber containing plasma, a the launcher comprising:
a waveguide structure having a cavity between an input at a first end of the cavity and an output at a second end of the cavity wherein the input is configured to receive the microwave energy and the output is configured for connection to the chamber containing plasma;
a permanent magnetic material combined with the waveguide structure, wherein the permanent magnet material is oriented such that a magnetic field generated from the permanent magnetic material is substantially parallel to a direction of a microwave propagation vector; and
a microwave vacuum window affixed to the input at the first end of the cavity and defines a vacuum region in the waveguide structure located between the microwave vacuum window and the chamber containing plasma.

* * * * *

UNITED STATES PATENT AND TRADEMARK OFFICE
CERTIFICATE OF CORRECTION

PATENT NO. : 6,225,592 B1
DATED : May 1, 2001
INVENTOR(S) : Doughty

It is certified that error appears in the above-identified patent and that said Letters Patent is hereby corrected as shown below:

<u>Column 1</u>,
Line 4, before "BACKGROUND OF THE INVENTION", please insert the heading

-- GOVERNMENT SUPPORT --

Line 6, after "GOVERNMENT SUPPORT", please insert -- This invention was made with Government support under Contract DE-FG03-97ER82459 awarded by the Department of Energy. The Government has certain rights in this invention. --

Signed and Sealed this

Fifth Day of October, 2004

JON W. DUDAS
*Director of the United States Patent and Trademark Office*